United States Patent
Baek et al.

(10) Patent No.: US 8,785,267 B2
(45) Date of Patent: Jul. 22, 2014

(54) METHODS OF MANUFACTURING SEMICONDUCTOR DEVICES INCLUDING TRANSISTORS

(75) Inventors: Sung-kweon Baek, Hwaseong-si (KR); Jin-soak Kim, Seoul (KR); Gab-jin Nam, Seoul (KR); Ji-young Min, Seoul (KR); Eun-ae Chang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 13/613,868

(22) Filed: Sep. 13, 2012

(65) Prior Publication Data
US 2013/0157428 A1    Jun. 20, 2013

(30) Foreign Application Priority Data
Dec. 14, 2011 (KR) .......................... 10-2011-0134462

(51) Int. Cl.
*H01L 21/338* (2006.01)
*H01L 21/336* (2006.01)

(52) U.S. Cl.
USPC .......................................... 438/183; 438/270

(58) Field of Classification Search
USPC ................. 438/176, 183, 259, 270, 283, 299
See application file for complete search history.

(56) References Cited

U.S. PATENT DOCUMENTS

| | | |
|---|---|---|
| 2006/0046448 A1* | 3/2006 | Barns et al. ................ 438/585 |
| 2008/0076216 A1 | 3/2008 | Pae et al. |
| 2009/0173994 A1 | 7/2009 | Min et al. |
| 2011/0156166 A1 | 6/2011 | Huang et al. |
| 2011/0193134 A1* | 8/2011 | Passlack ...................... 257/192 |
| 2012/0175711 A1* | 7/2012 | Ramachandran et al. ..... 257/383 |
| 2012/0223387 A1* | 9/2012 | Cui et al. ..................... 257/366 |

FOREIGN PATENT DOCUMENTS

| | | |
|---|---|---|
| KR | 1020090019160 A | 2/2009 |
| KR | 1020090044550 A | 5/2009 |
| KR | 1020100104900 A | 9/2010 |

* cited by examiner

*Primary Examiner* — Hsien Ming Lee
(74) *Attorney, Agent, or Firm* — Myers Bigel Sibley & Sajovec, P.A.

(57) ABSTRACT

A method of manufacturing a semiconductor device includes forming a gate insulation layer pattern on a substrate, forming a sacrificial layer including impurities on the gate insulation layer pattern, annealing the sacrificial layer so that the impurities in the sacrificial layer diffuse into the gate insulation layer pattern, removing the sacrificial layer, and forming a gate electrode on the gate insulation layer pattern.

17 Claims, 17 Drawing Sheets

METHODS OF MANUFACTURING SEMICONDUCTOR DEVICES INCLUDING TRANSISTORS

CROSS-REFERENCE TO RELATED APPLICATIONS

This application claims priority under 35 U.S.C. §119 from Korean Patent Application No. 10-2011-0134462, filed on Dec. 14, 2011, in the Korean Intellectual Property Office, the disclosure of which is incorporated herein in its entirety by reference.

BACKGROUND

The inventive concepts relate to methods of manufacturing semiconductor devices including a transistors, and more particularly, to semiconductor devices including transistors using a high-dielectric constant (k) gate insulation layer.

In order to increase the integration density of semiconductor devices, it may be desirable to form the gate insulation layers of transistors in the device using a material with a high dielectric constant (i.e., a high-k material). However, when a high-k gate insulation layer is used, the threshold voltage of the semiconductor device may be changed and the flat band voltage of the device may be increased, which can adversely affect the electrical characteristics of the semiconductor device.

SUMMARY

Some embodiments of the inventive concepts provide methods of manufacturing semiconductor devices having excellent electrical characteristics.

According to some embodiments, there is provided a method of manufacturing a semiconductor device, including forming a gate insulation layer on a substrate, forming a sacrificial layer including impurities on the gate insulation layer, annealing the sacrificial layer so that the impurities in the sacrificial layer diffuse into the gate insulation layer, removing the sacrificial layer, and forming a gate electrode on the gate insulation layer.

The impurities may include boron or phosphorus.

The annealing process may be performed at a temperature of about 900° C. to about 1100° C.

The sacrificial layer may include a polysilicon layer.

Forming the sacrificial layer may include doping impurities in-situ, such as while forming a polysilicon layer. A sacrificial layer doped in-situ with impurities may be formed by performing a chemical vapor deposition (CVD) process or an atomic layer deposition (ALD) process.

Forming the sacrificial layer may include forming a polysilicon layer that is not doped with impurities on the gate insulation layer, and implanting impurities on the polysilicon layer by performing an ion implantation process. The ion implantation process may be performed using an impurity dose range between $10^{14}$ and $10^{17}$ atoms/cm$^2$.

Forming the sacrificial layer may include forming a buffer layer pattern on the gate insulation layer, and forming the sacrificial layer doped with impurities on the buffer layer pattern. The buffer layer pattern may include titanium, titanium nitride, tantalum, tantalum nitride, and/or ruthenium.

According to further embodiments, there is provided a method of manufacturing a semiconductor device, the method including forming a trench on a substrate, forming a gate insulation layer on an inner wall of the trench, forming a sacrificial layer including impurities on the gate insulation layer, annealing the sacrificial layer to cause the impurities in the sacrificial layer to diffuse into the gate insulation layer, removing the sacrificial layer, and forming a gate electrode on the gate insulation layer.

The method may further include forming a buffer layer on the gate insulation layer. Forming the gate electrode may include forming a gate electrode layer to at least partially fill the trench on the buffer layer, and performing an etch-back process on the gate electrode layer until a top surface of the gate electrode layer is lower than a top surface of the substrate.

The method may further include forming an impurity region on the substrate adjacent to the trench by performing an ion implantation process on the substrate.

The sacrificial layer may include a polysilicon layer.

A method of manufacturing a semiconductor device including a high-k gate insulation layer according to some embodiments includes forming a buffer layer on the high-k gate insulation layer, forming a sacrificial layer containing impurities on the buffer layer, diffusing impurities from the sacrificial layer through the buffer layer and into the high-k gate insulation layer, removing the sacrificial layer, and forming a gate electrode on the buffer layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EMBODIMENTS

Figure 1:
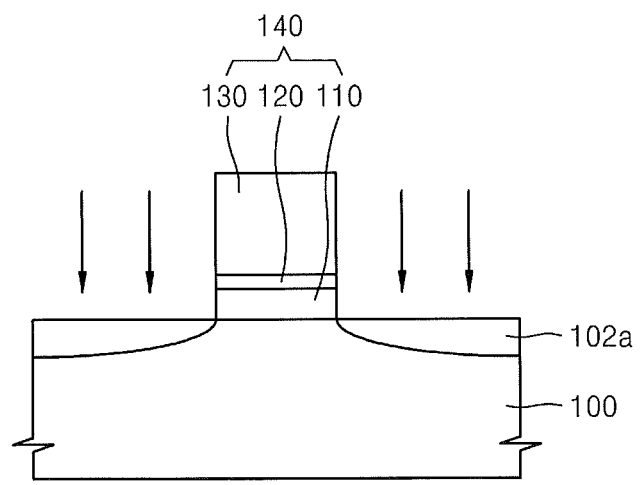
FIGS. 1 to 7 are cross-sectional views showing methods of manufacturing a semiconductor device, according to some embodiments.

The present inventive concepts will now be described more fully with reference to the accompanying drawings, in which exemplary embodiments of the inventive concepts are shown. The invention may, however, be embodied in many different forms, and should not be construed as being limited to the embodiments set forth herein; rather, these embodiments are provided so that this disclosure will be thorough and complete, and will fully convey the concept of the invention to one of ordinary skill in the art. In the drawings, the thicknesses of layers and regions are exaggerated for clarity. As used herein, the term "and/or" includes any and all combinations of one or more of the associated listed items.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to cross-section illustrations that are schematic illustrations of idealized embodiments (and intermediate structures). The thickness of layers and regions in the drawings may be exaggerated for clarity. Additionally, variations from the shapes of the illustrations as a result, for example, of manufacturing techniques and/or tolerances, are to be expected. Thus, embodiments illustrated herein should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Thus, the regions illustrated in the figures are schematic in nature and their shapes are not intended to illustrate the actual shape of a region of a device and are not intended to limit the scope of the inventive concepts.

FIGS. 1 to 7 are cross-sectional views showing methods of manufacturing a semiconductor device, according to some embodiments.

Referring to FIG. 1, a preliminary gate structure 140 is formed on a substrate 100.

The substrate 100 may include a semiconductor substrate, such as a silicon substrate, a germanium substrate, or a silicon-germanium substrate, a silicon-on-insulator (SOI) substrate, a germanium-on-insulator (GOI) substrate, or the like. The substrate 100 may further include a well region including p-type or n-type impurities.

The preliminary gate structure 140 may be formed by sequentially forming a gate insulation layer, a buffer layer, and a preliminary gate electrode layer on the substrate 100 and then patterning the gate insulation layer, the buffer layer, and the preliminary gate electrode layer formed on the substrate 100. Accordingly, the preliminary gate structure 140 may include a gate insulation layer 10, a buffer layer pattern 120, and a preliminary gate electrode 130 sequentially stacked on the substrate 100. In some embodiments, there may be a plurality of the preliminary gate structures 140, and the preliminary gate structures 140 may be spaced apart from one another at predetermined intervals and may extend in one direction.

In some embodiments, the gate insulation layer 110 may be formed by a deposition process, such as a chemical vapor deposition (CVD) process or an atomic layer deposition (ALD) process using silicon oxide or a metal oxide having a high dielectric constant (a high-k dielectric material). For example, the gate insulation layer 110 may be formed of an insulating material having a dielectric constant equal to or more than 10. The gate insulation layer 110 may be formed of any one of hafnium oxide, hafnium silicon oxide, lanthanum oxide, zirconium oxide, tantalum oxide, titanium oxide, and aluminum oxide, or a combination thereof.

The buffer layer pattern 120 may be formed of using titanium, titanium nitride, tantalum, tantalum nitride, ruthenium, or the like. In some embodiments, the buffer layer pattern 120 may be formed to have a thickness of about 1 nm to about 5 nm. If the buffer layer pattern 120 is too thin, the buffer layer pattern 120 may not serve as an effective protection layer for the gate insulation layer 110 in a subsequent process of removing the preliminary gate electrode 130. On the other hand, if the buffer layer pattern 120 is too thick, impurities may not easily diffuse into the gate insulation layer 110 through the buffer layer pattern 120.

The preliminary gate electrode 130 may be formed using polysilicon, amorphous silicon, or the like by a CVD process, an ALD process, a physical vapor deposition (PVD) process, or the like.

Although not shown in the drawing, an interface layer (not shown) may further be formed between the substrate 100 and the gate insulation layer 110. The interface layer may be formed of an oxide, such as silicon oxide, or an oxynitride, such as silicon oxynitride. For example, the interface layer may be formed by performing a thermal oxidizing process or a CVD process on the substrate 100.

After formation of the preliminary gate structure 140, first impurities may be implanted into the substrate 100 using the preliminary gate structure 140 as an ion implantation mask to form a first impurity region 102a in an upper portion of the substrate 100 adjacent to the preliminary gate structure 140. The first impurities may be n-type impurities, such as phosphorus or arsenic, or p-type impurities, such as boron.

Figure 2:
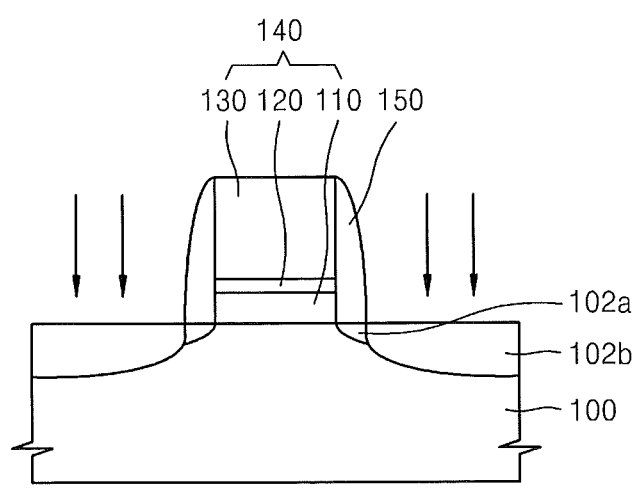

Referring to FIG. 2, a spacer 150 is formed on a sidewall of the preliminary gate structure 140.

In some embodiments, a spacer layer (not shown) may be formed on the substrate 100 to cover the preliminary gate structure 140, and then the spacer layer may be etched using an anisotropic etch process, leaving the spacer 150 on the sidewalls of the preliminary gate structure 140. The spacer layer may be formed of any one of silicon oxide, silicon nitride, and silicon oxynitride, or a combination thereof.

Then, second impurities are implanted into the substrate 100 using the preliminary gate structure 140 and the spacer 150 as ion implantation masks to form a second impurity region 102b in an upper portion of the substrate 100 adjacent to the preliminary gate structure 140 and the spacer 150. An annealing process may be performed after the second impurities are implanted into the substrate 100.

In some embodiments, the second impurities may be n-type impurities such as phosphorus or arsenic, or p-type impurities such as boron. The second impurities may be formed to have a conductivity type the same as that of the first impurities, and the second impurity region 102b may have a doping concentration that is higher than that of the first impurity region 102a. Accordingly, the first impurity region 102a and the second impurity region 102b may form an impurity region having a lightly doped drain (LDD) structure.

Figure 3:
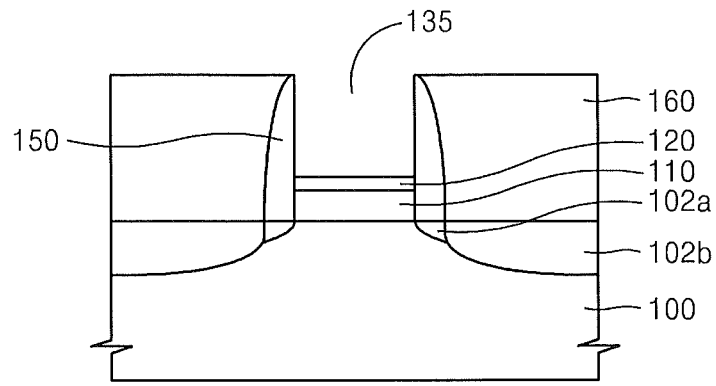

Referring to FIG. 3, an insulation layer (not shown) is formed on the substrate 100 to cover the preliminary gate structure 140 and the spacer 150, and then the insulation layer is planarized until a top surface of the preliminary gate structure 140 is exposed to form a first insulating interlayer 160 on the substrate 100.

Then, the preliminary gate electrode 140 is removed, which forms a first trench 135 on the buffer layer pattern 120. In this regard, the first trench 135 refers to a space that is defined by sidewalls of the spacers 150 and the buffer layer pattern 120. In some embodiments, the preliminary gate electrode 140 may be removed by a wet etching process using the buffer layer pattern 120 as an etching stop layer.

Figure 4:
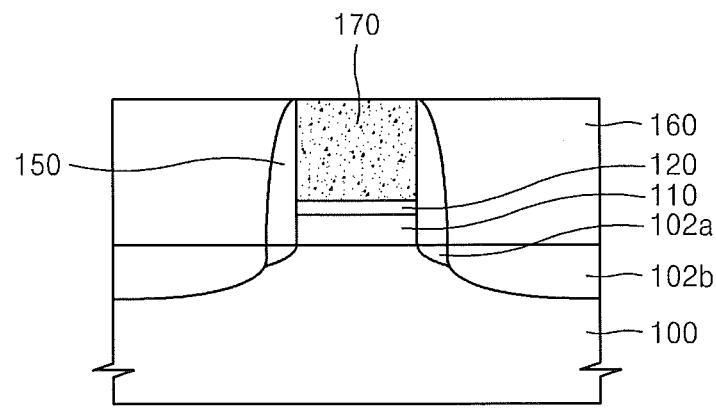

Referring to FIG. 4, a sacrificial layer 170 doped with impurities is formed on the first insulating interlayer 160 to at least partially fill the first trench 135. In some embodiments, the sacrificial layer 170 doped with impurities may include a polysilicon layer doped with impurities. For example, the sacrificial layer 170 doped with impurities may be formed by doping impurities in-situ in a process of forming the polysilicon layer by performing a CVD process, an ALD process, or the like. Alternatively, the sacrificial layer 170 doped with impurities may be formed by doping impurities in-situ in a process of forming the polysilicon layer by performing a sputtering process, or the like. In some embodiments, the impurities may include boron or phosphorus.

In some embodiments, the sacrificial layer 170 doped with impurities may be formed to have a sufficient thickness to fill the first trench 135. In this case, the sacrificial layer 170 doped with impurities may be planarized until a top surface of the first insulating interlayer 160 is exposed.

In some embodiments, the sacrificial layer 170 doped with impurities may be formed to be conformal on an inner wall of the first trench 135 and may not completely fill the first trench 135.

Figure 5:
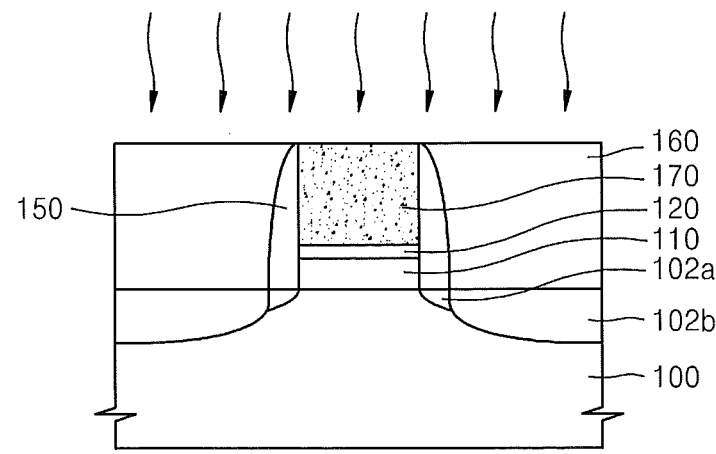

Referring to FIG. 5, the impurities included in the sacrificial layer 170 may be diffused into the gate insulation layer 110 by performing an annealing process on the substrate 100. The annealing process may be performed using a rapid thermal annealing (RTA) process, a flash lamp annealing process, a laser annealing process, or the like. In an example embodiment, the annealing process may be performed at a temperature of about 700° C. to about 1300° C. For example, the annealing process may be performed at a temperature of about 900° C. to about 1100° C. As the buffer layer pattern 120 is formed thin enough, the impurities included in the sacrificial layer 170 may diffuse into the gate insulation layer 110 through the buffer layer pattern 120 during the annealing process.

Figure 6:
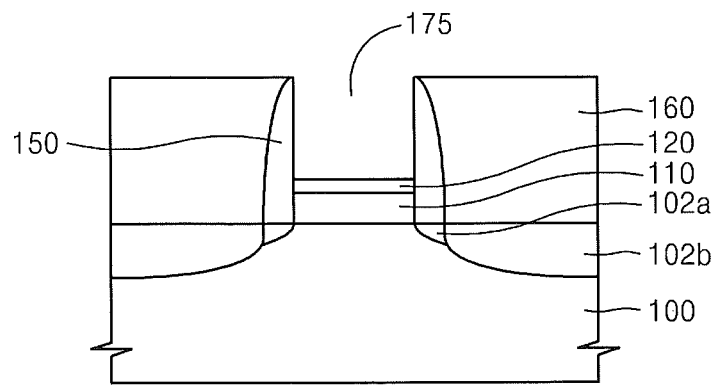

Referring to FIG. 6, the sacrificial layer 170 doped with impurities may be removed.

In some embodiments, the sacrificial layer 170 doped with impurities may be removed by a wet etching process, or the like. For example, the wet etching process may be performed using an etching solution including tetramethyl ammonium hydroxide (TMAH). The buffer layer pattern 120 may prevent the gate insulation layer 110 from being damaged during the wet etching process. Accordingly, the buffer layer pattern 120 and sidewalls of the spacers 150 may be exposed, and a second trench 175 defined by the buffer layer pattern 120 and the sidewalls of the spacers 150 may be formed.

Figure 7:
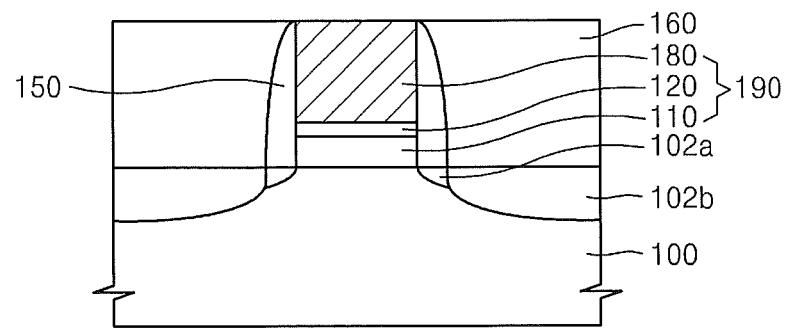

Referring to FIG. 7, a gate electrode 180 is formed in the second trench 175 on the buffer layer pattern 120 and the sidewalls of the spacers 150.

In some embodiments, a gate electrode layer (not shown) filling the second trench may be formed on the first insulating interlayer 160, and the gate electrode layer may be planarized until the top surface of the first insulating interlayer 160 is exposed to form the gate electrode 180.

In some embodiments, the gate electrode 180 may be formed using a conductive material, such as a metal, metal nitride, or the like. For example, the gate electrode 180 may be formed of any of copper, titanium, tantalum, ruthenium, tungsten, cobalt, nickel, aluminum, hafnium, zirconium, palladium, platinum, titanium nitride, and tantalum nitride, or a combination thereof.

The gate insulation layer 110, the buffer layer pattern 120, and the gate electrode 180 that are sequentially stacked on the substrate 100 may form a gate structure 190. The spacer 150 is disposed on a sidewall of the gate structure 190, and first and second impurity regions 102a and 102b are formed in an upper portion of the substrate 100 adjacent to the gate structure 190 and the spacer 150. The gate structure 190 and the first and second impurity regions 102a and 102b may serve as a transistor.

A semiconductor device may be formed by performing the above-described operations.

In general, the thicker a gate insulation layer, e.g., a high-k gate insulation layer, is, the more defects, including positive charges, such as oxygen vacancies, are generated in the gate insulation layer. Thus, a flat band voltage of the transistor may be decreased. According to some embodiments, since the annealing process is performed on the sacrificial layer 170 doped with impurities, the impurities may diffuse into the gate insulation layer 110, and thus the defects may be cured or otherwise neutralized, thereby preventing or reducing the reduction in the flat band voltage of the transistor and preventing or reducing an increase in the threshold voltage of the transistor. The semiconductor device may have excellent electrical characteristics.

FIGS. 8 to 12 are cross-sectional views showing methods of manufacturing a semiconductor device, according to further embodiments of the inventive concept. The methods of manufacturing semiconductor devices shown in FIGS. 8 to 12 are similar to the methods of manufacturing semiconductor devices described with reference to FIGS. 1 to 7 except for a method of manufacturing a sacrificial layer 270a doped with impurities, and thus only differences between the embodiments described with reference to FIGS. 1 to 7 and the embodiments of FIGS. 8 to 12 will be described below.

Figure 8:
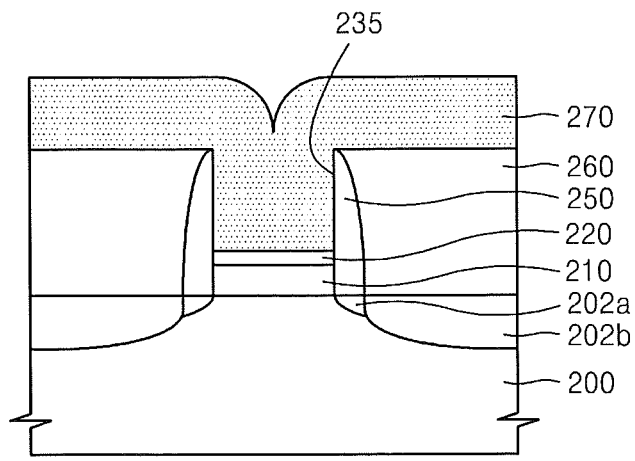
FIGS. 8 to 12 are cross-sectional views showing methods of manufacturing a semiconductor device, according to some embodiments.

Referring to FIG. 8, by performing the same or similar processes described with reference to FIGS. 1 to 3, a gate insulation layer 210 and a buffer layer pattern 220 are sequentially formed on a substrate 200 and then a first trench 235 defined by the buffer layer pattern 220 and sidewalls of spacers 250 is formed.

A sacrificial layer 270 is formed on a first insulating interlayer 260 to at least partially fill a first trench 235. In some embodiments, the sacrificial layer 270 may be a polysilicon layer formed by performing a CVD process, an ALD process, or the like. In an example embodiment, the sacrificial layer 270 may be formed to be thick enough to completely fill the first trench 235. Although not shown in FIG. 8, an upper portion of the sacrificial layer 270 may be planarized until a top surface of the first insulating interlayer 260 is exposed, and thus a top surface of the sacrificial layer 270 may be coplanar with the top surface of the first insulating interlayer 260. In some embodiments, the sacrificial layer 270 may be formed to be conformal on an inner wall of the first trench 235 so as not to completely fill the first trench 235.

Figure 9:
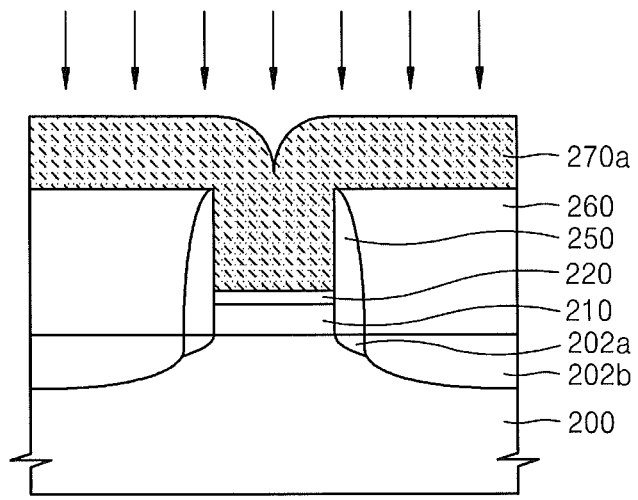

Referring to FIG. 9, a sacrificial layer 270a doped with impurities may be formed by implanting impurities into the sacrificial layer 270 by an ion implantation process. The impurities may include boron or phosphorus. In some embodiments, the ion implantation process may be performed using an impurity dose range between $10^{14}$ and $10^{17}$ atom/cm$^2$. Meanwhile, an amount of the impurities may vary according to a thickness of the sacrificial layer 270.

Figure 10:
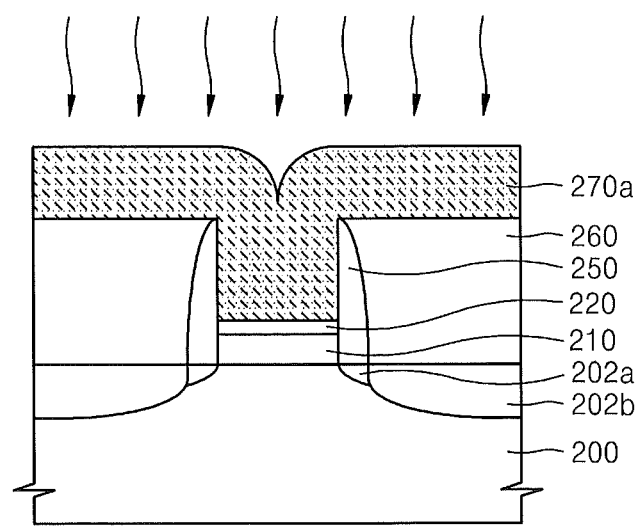

Referring to FIG. 10, the impurities included in the sacrificial layer 270a doped with impurities may be diffused into the gate insulation layer 210 by performing an annealing process on the substrate 200. In an example embodiment, the annealing process may be performed at a temperature of about 700° C. to about 1300° C. For example, the annealing process may be performed at a temperature of about 900° C. to about 1100° C. The buffer layer pattern 220 is formed to be thin enough that the impurities included in the sacrificial layer 270a doped with impurities may diffuse into the gate insulation layer 210 through the buffer layer pattern 220.

Figure 11:
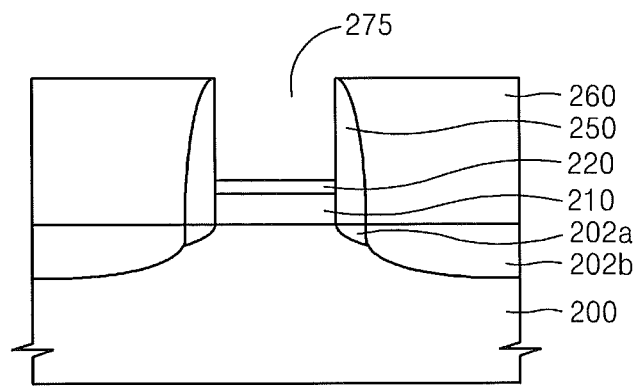

Referring to FIG. 11, a second trench 275 is formed by removing the sacrificial layer 270a doped with impurities and exposing the buffer layer pattern 220 and sidewalls of the spacers 250. In some embodiments, the sacrificial layer 270a doped with impurities may be removed by performing a wet etching process, or the like. The buffer layer pattern 220 may prevent or reduce the gate insulation layer 210 from being damaged during the wet etching process.

Figure 12:
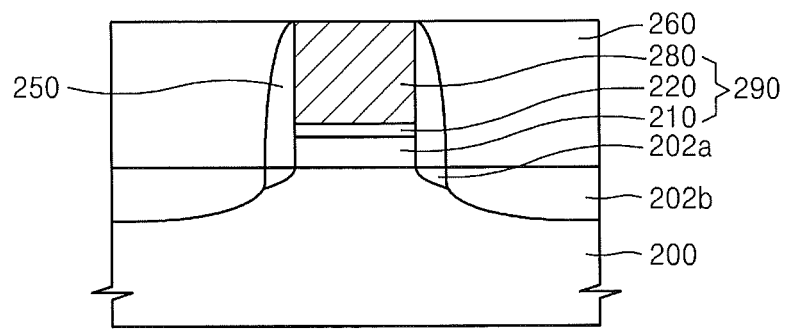

Referring to FIG. 12, a gate electrode 280 is formed on the buffer layer pattern 220 and the sidewalls of the spacer 250 to at least partially fill the second trench 275.

The gate insulation layer 210, the buffer layer pattern 220, and the gate electrode 280 that are sequentially stacked on the substrate 200 may form a gate structure 290, and first and second impurity regions 202a and 202b are formed in an upper portion of the substrate 200 adjacent to the gate structure 290 and the spacer 250. The gate structure 290 and the first and second impurity regions 202a and 202b may serve as a transistor.

According to the embodiments illustrated in FIGS. 8 to 12, the sacrificial layer 270 is formed on the gate insulation layer 210 and the buffer layer pattern 220, and then the sacrificial layer 270a doped with impurities may be formed by performing an ion implantation process on the sacrificial layer 270. Then, the impurities may be diffused into the gate insulation layer 210 by performing an annealing process, which may cure or otherwise neutralize the defects that may be present in the gate insulation layer 210. The semiconductor device may have excellent electrical characteristics.

FIGS. 13 to 17 are cross-sectional views showing methods of manufacturing semiconductor devices, according to further embodiments of the inventive concept.

Figure 13:
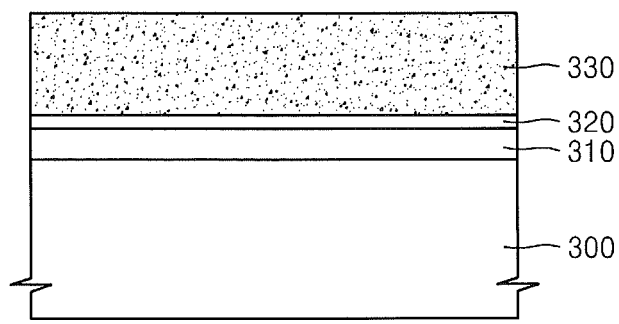
FIGS. 13 to 17 are cross-sectional views showing methods of manufacturing a semiconductor device, according to some embodiments.

Referring to FIG. 13, a gate insulation layer 310 and a buffer layer 320 are sequentially formed on a substrate 300. The gate insulation layer 310 may be formed of a high dielectric metal oxide. The buffer layer 320 may be formed of titanium, titanium nitride, tantalum, tantalum nitride, ruthenium, or the like. Meanwhile, an interface layer (not shown) may further be formed between the substrate 300 and the gate insulation layer 310. The interface layer may be formed of an oxide, such as silicon oxide, or an oxynitride, such as silicon oxynitride.

Then, a sacrificial layer 330 that is doped with impurities is formed on the buffer layer 320. In an example embodiment, the sacrificial layer 330 doped with impurities may be formed by doping impurities in-situ in a process of forming a polysilicon layer by performing a CVD process, an ALD process, a PVD process, or the like. The impurities may include boron or phosphorus.

Alternatively, the sacrificial layer 330 doped with impurities may be formed by forming a polysilicon layer and then implanting impurities into the polysilicon layer by an ion implantation process.

Figure 14:
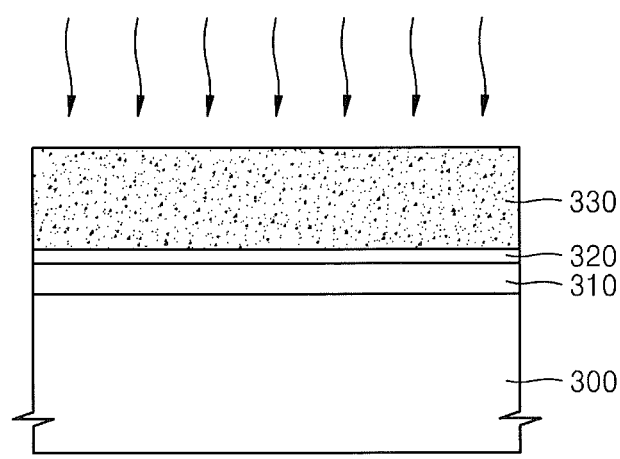

Referring to FIG. 14, the impurities included in the sacrificial layer 330 may be diffused into the gate insulation layer 310 by performing an annealing process on the substrate 300. In an example embodiment, the annealing process may be performed at a temperature of about 700° C. to about 1300° C. For example, the annealing process may be performed at a temperature of about 900° C. to about 1100° C. The buffer layer 320 is formed thin enough that the impurities included in the sacrificial layer 330 may diffuse into the gate insulation layer 310 through the buffer layer 320 in the annealing process.

Figure 15:
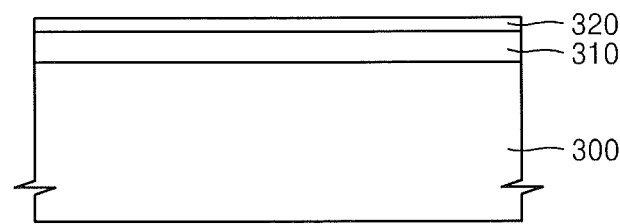

Referring to FIG. 15, the sacrificial layer 330 doped with impurities may be removed to expose the buffer layer 320. In some embodiments, the sacrificial layer 330 doped with impurities may be removed using a wet etching process, or the like.

Figure 16:
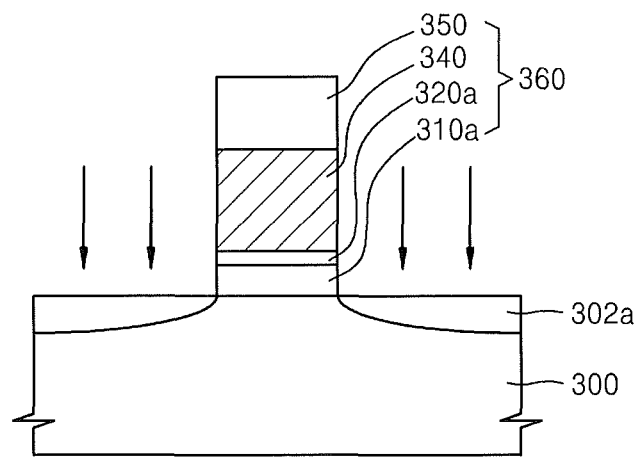

Referring to FIG. 16, a gate electrode layer (not shown) and a gate mask layer (not shown) may be sequentially formed on the buffer layer 320. The gate electrode layer may be formed of doped polysilicon, a metal, metal nitride, and/or metal silicide. For example, the gate electrode layer may be formed of any of aluminum, tungsten, titanium, tantalum, ruthenium, titanium nitride, tantalum nitride, and polysilicon, or a combination thereof. The gate mask layer may be formed of silicon nitride or silicon oxynitride. The gate conductive layer and the gate mask layer may be formed using a CVD process, an ALD process, or the like.

Then, a gate structure 360 is formed on the substrate 300 by sequentially patterning the gate mask layer, the gate electrode layer, the buffer layer 320, and the gate insulation layer 310. The gate structure 360 may include a gate insulation layer 310a, a buffer layer pattern 320a, a gate electrode 340, and a gate mask 350 that are sequentially stacked on the substrate 300.

Impurities are implanted into the substrate 300 using the gate structure 360 as an ion implantation mask to form a first impurity region 302a in an upper portion of the substrate 300 adjacent to the gate structure 360.

Figure 17:
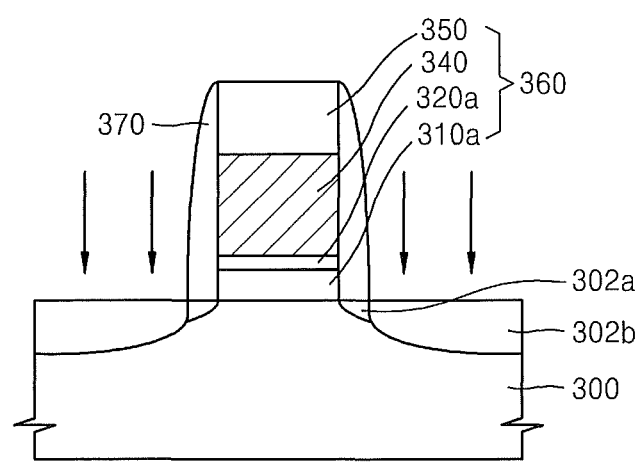

Referring to FIG. 17, a spacer layer (not shown) is formed on the substrate 300 to cover the gate structure 360, and then a spacer 370 is formed on a sidewall of the gate structure 360 by performing an anisotropic etching process on the spacer layer.

Then, impurities are implanted into the substrate 300 using the gate structure 360 and the spacer 370 as ion implantation masks to form a second impurity region 302b in an upper portion of the substrate 300 adjacent to the gate structure 360 and the spacer 370. The gate structure 360 and the first and second impurity regions 302a and 302b may serve as a transistor.

According to embodiments of the inventive concept illustrated in FIGS. 13 to 17, a sacrificial layer 330 that is doped with impurities is formed, and then the impurities may be diffused into the gate insulation layer 310, thereby curing or otherwise neutralizing defects that may be present in the gate insulation layer 310. The semiconductor device may have excellent electrical characteristics.

FIGS. 18 to 23 are cross-sectional views showing methods of manufacturing semiconductor devices, according to further embodiments of the inventive concept. In the embodiments illustrated in FIGS. 18 to 23, the semiconductor device is a complementary transistor including a P-channel metal oxide semiconductor (PMOS) transistor and an N-channel metal oxide semiconductor (NMOS) transistor.

Figure 18:
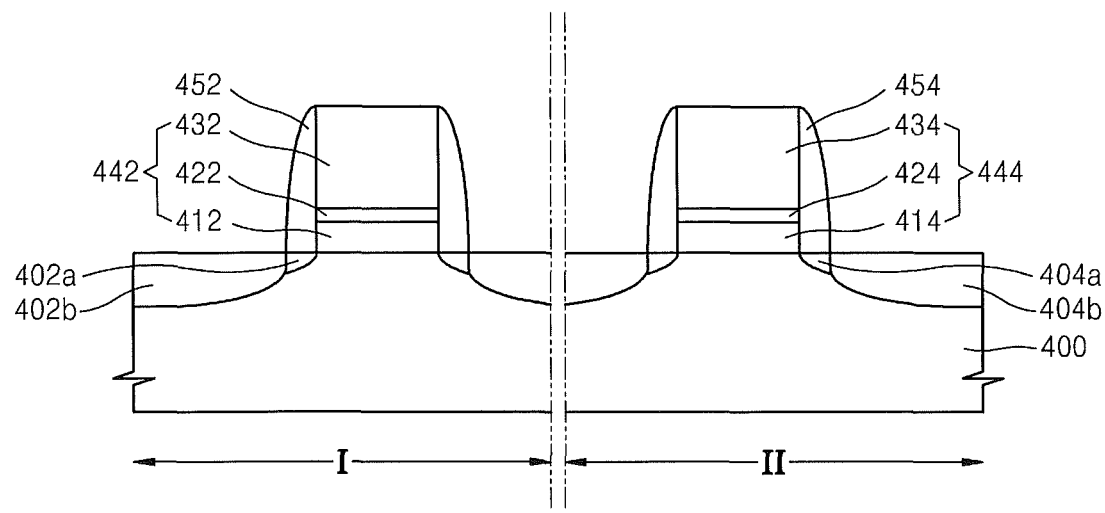
FIGS. 18 to 23 are cross-sectional views showing methods of manufacturing a semiconductor device, according to some embodiments.

Referring to FIG. 18, a substrate 400 may be divided into a first region I and a second region II. The first region I may be a region on which a PMOS transistor will be formed, and the second region II may be a region on which an NMOS transistor will be formed. An n-type well region (not shown) may further be formed in the first region I of the substrate 400, and/or a p-type well region (not shown) may further be formed in the second region II of the substrate 400.

A first preliminary gate structure 442 and a second preliminary gate structure 444 are formed in the first region I and the second region II of the substrate 400, respectively. The first preliminary gate structure 442 may include a first gate insulation layer 412, a first buffer layer pattern 422, and a first preliminary gate electrode 432 that are sequentially stacked in the first region I, and the second preliminary gate structure 444 may include a second gate insulation layer 414, a second buffer layer pattern 424, and a second preliminary gate electrode 434 that are sequentially stacked in the second region II.

Then, a first impurity region 402a is formed in an upper portion of the substrate 400 by forming a first mask (not shown) to cover the second region II of the substrate 400 and then implanting first impurities into the substrate 400 using the preliminary first gate structure 442 and the first mask as ion implantation masks. The first impurities may be p-type impurities such as boron.

Then, the first mask may be removed.

A second impurity region 404a is formed in an upper portion of the substrate 400 of the second region II adjacent to the preliminary second gate structure 444 by forming a second mask (not shown) to cover the first region I of the substrate 400 and then implanting second impurities into the substrate 400 using the preliminary second gate structure 444 and the second mask as ion implantation masks. The second impurities may be n-type impurities such as phosphorus, boron, or the like.

Then, the second mask may be removed.

A first spacer 452 and a second spacer 454 are formed on sidewalls of the first and second preliminary gate structures 442 and 444 by forming a spacer layer (not shown) on the substrate 400 to cover the first and second preliminary gate structures 442 and 444 and then performing an anisotropic etching process on the spacer layer.

Next, a third impurity region 402b is formed in an upper portion of the substrate 400 adjacent to the preliminary first gate structure 442 and the first spacer 452 in the first region I by forming a third mask (not shown) to cover the second region II of the substrate 400 and then implanting third impurities into the substrate 400 using the preliminary first gate structure 442, the first spacer 452, and the third mask as ion implantation masks. The third impurities may be p-type impurities such as boron.

Then, the third mask may be removed.

A fourth impurity region 404b is formed in an upper portion of the substrate 400 adjacent to the preliminary second gate structure 444 and the second spacer 454 in the second region II by forming a second region II to cover the first region I of the substrate 400 and then implanting fourth impurities into the substrate 400 by using the preliminary second gate structure 444, the second spacer 454, and the fourth mask as ion implantation masks. The fourth impurities may be n-type impurities such as phosphorus or arsenic.

Then, the fourth mask may be removed.

The third impurity region 402b may include impurities having a conductivity type the same as that of the first impurity region 402a, and a concentration of the impurities of the third impurity region 402b may be higher than that of the first impurity region 402a. Also, the fourth impurity region 404b may include impurities having a conductivity type the same as that of the second impurity region 404a, and a concentration of the impurities of the fourth impurity region 404b may be higher than that of the second impurity region 404a.

Accordingly, the first impurity region 402a and the third impurity region 402b that include p-type impurities may be formed to have an LDD structure in the first region I of the substrate 400, the second impurity region 404a and the fourth impurity region 404b that include n-type impurities may be formed to have an LDD structure in the second region II of the substrate 400.

Figure 19:
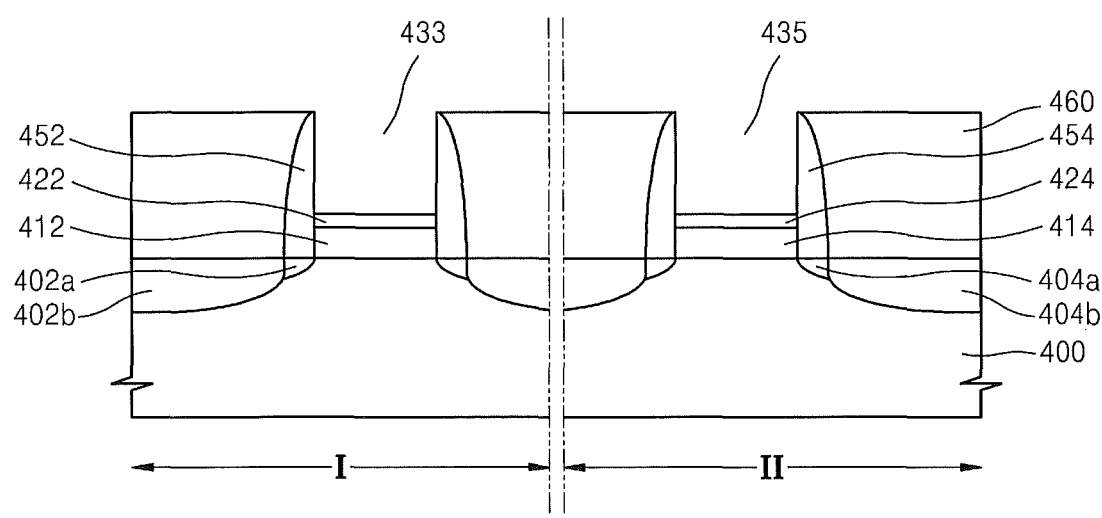

Referring to FIG. 19, an insulating interlayer 460 is formed by forming an insulating layer (not shown) on the substrate 400 to cover the first and second preliminary gate structures 442 and 444 and then planarizing the insulating layer until top surfaces of the first and second preliminary gate structures 442 and 444 are exposed.

Then, the first preliminary gate electrode 432 and the second preliminary gate electrode 434 are removed to form a first trench 433 and a second trench 435 on the first buffer layer pattern 422 and the second buffer layer pattern 424, respectively. In this regard, the first trench 433 is defined by the first buffer layer pattern 422 and sidewalls of the first spacer 452, and the second trench 435 is defined by the second buffer layer pattern 424 and sidewalls of the second spacer 454.

Figure 20:
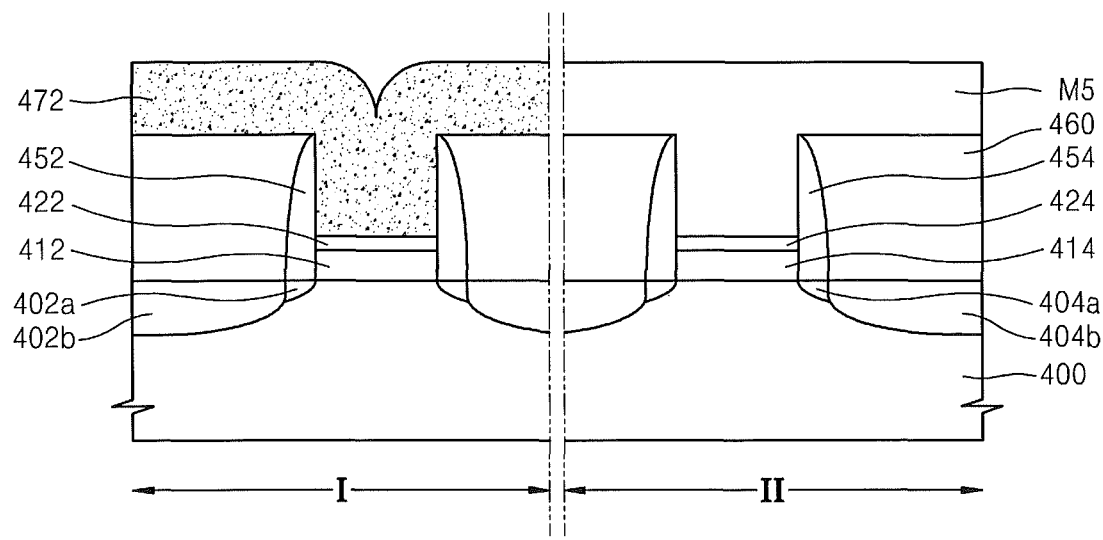

Referring to FIG. 20, a fifth mask M5 is formed to cover the second region II of the substrate 400, and a first sacrificial layer 472 doped with fifth impurities is formed to at least partially fill the first trench 433 in the first region I of the substrate 400. The fifth impurities may be boron or phosphorus.

Then, the fifth mask M5 is removed.

Figure 21:
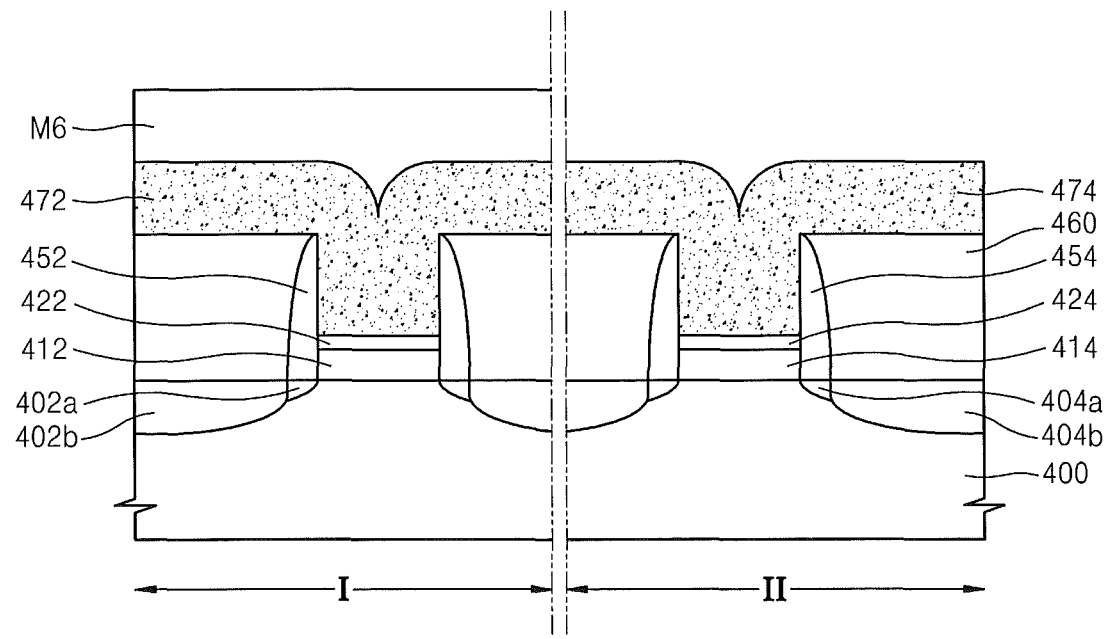

Referring to FIG. 21, a sixth mask M6 is formed to cover the first region I of the substrate 400, and then a second sacrificial layer 474 doped with sixth impurities is formed to at least partially fill the second trench 435 in the second region II of the substrate 400. The sixth impurities may be boron or phosphorus.

Then, the sixth mask M6 is removed.

Figure 22:
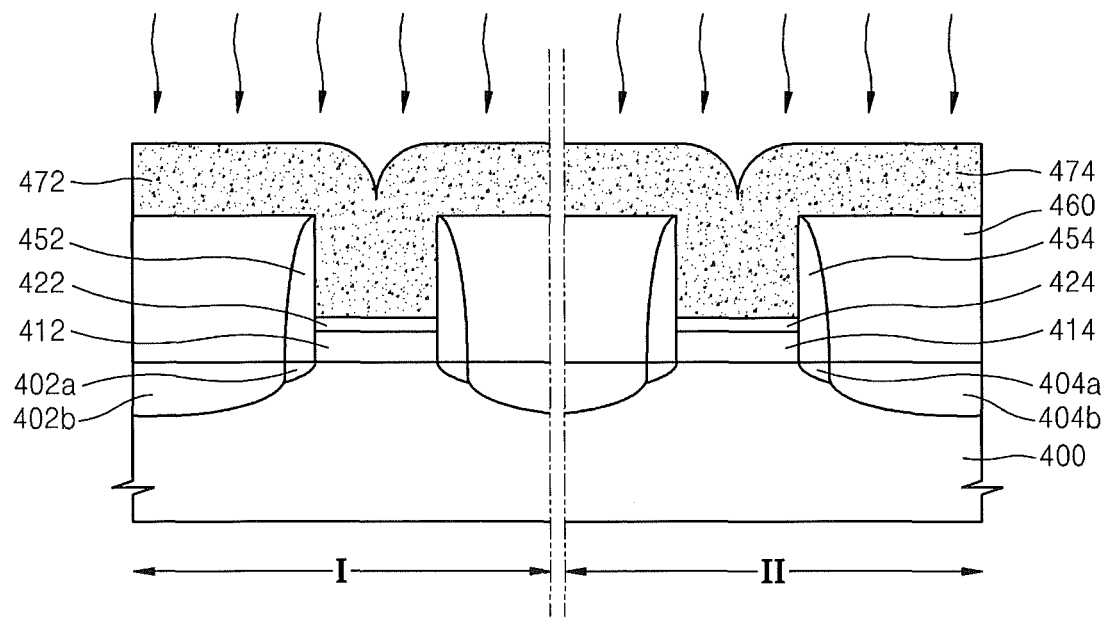

Referring to FIG. 22, the impurities included in the first sacrificial layer 472 doped with the fifth impurities and the impurities included in the second sacrificial layer 474 doped with the sixth impurities may be diffused into the first gate insulation layer 412 and the second gate insulation layer 414, respectively, by performing an annealing process on the substrate 400.

Figure 23:
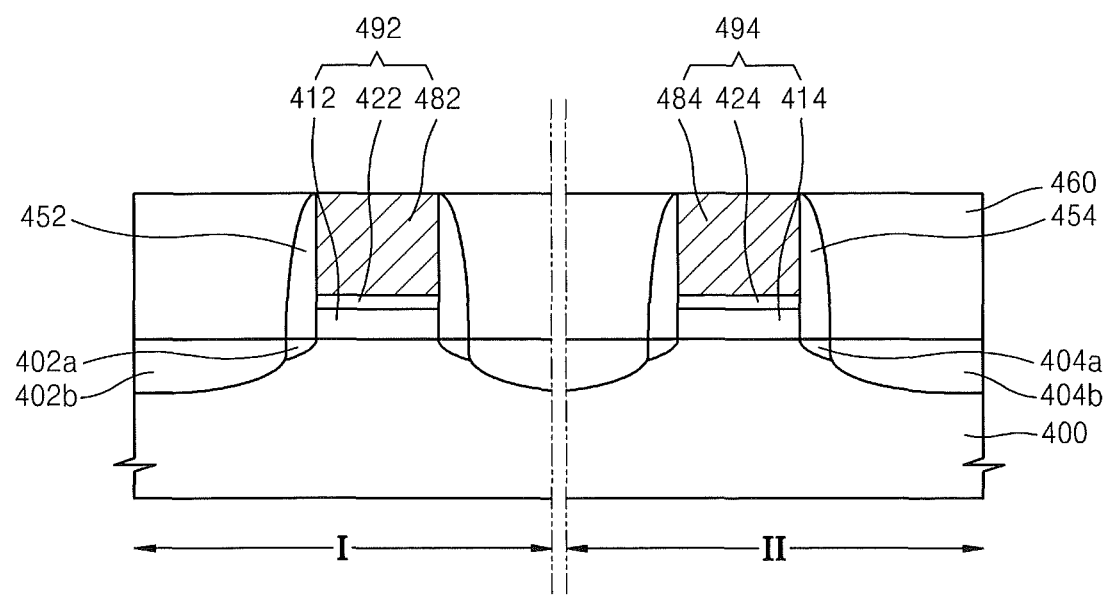

Referring to FIG. 23, the first and second sacrificial layers 472 and 474 are removed. Then, a first gate electrode 482 is formed on the exposed first buffer layer pattern 422 and the sidewall of the first spacer 452, and a second gate electrode 484 is formed on the exposed second buffer layer pattern 424 and the sidewall of the second spacer 454.

Accordingly, a first gate structure 492 and a second gate structure 494 are formed in the first region I and the second region II of the substrate 400, respectively. The first gate structure 492, and the first and third impurity regions 402a and 402b may serve as a PMOS transistor, and the second gate structure 494 and the second and fourth impurity regions 404a and 404b may serve as an NMOS transistor.

According to the embodiments of the inventive concept illustrated in FIGS. 18-23, a PMOS transistor and a NMOS transistor may be formed using a sacrificial layer into which additional impurities are implanted, and then the impurities are diffused into gate insulation layers by performing an annealing process, thereby curing or otherwise neutralizing defects that may be present in the gate insulation layers. Also, the PMOS transistor and the NMOS transistor may independently control a flat band voltage or a threshold voltage. The semiconductor device may have excellent electrical characteristics.

FIGS. 24 to 28 are cross-sectional views showing methods of manufacturing semiconductor devices according to further embodiments of the inventive concept. The methods of manufacturing semiconductor devices illustrated in FIGS. 24 to 28 may be substantially similar to the methods described with reference to FIGS. 18 to 23 except for a method of forming first and second sacrificial layers 572 and 574, and thus only differences between the embodiments described with reference to FIGS. 18 to 23 and the embodiments illustrated in FIGS. 24 to 28 will be described below.

First, the processes described with reference to FIGS. 18 and 19 are performed.

Figure 24:
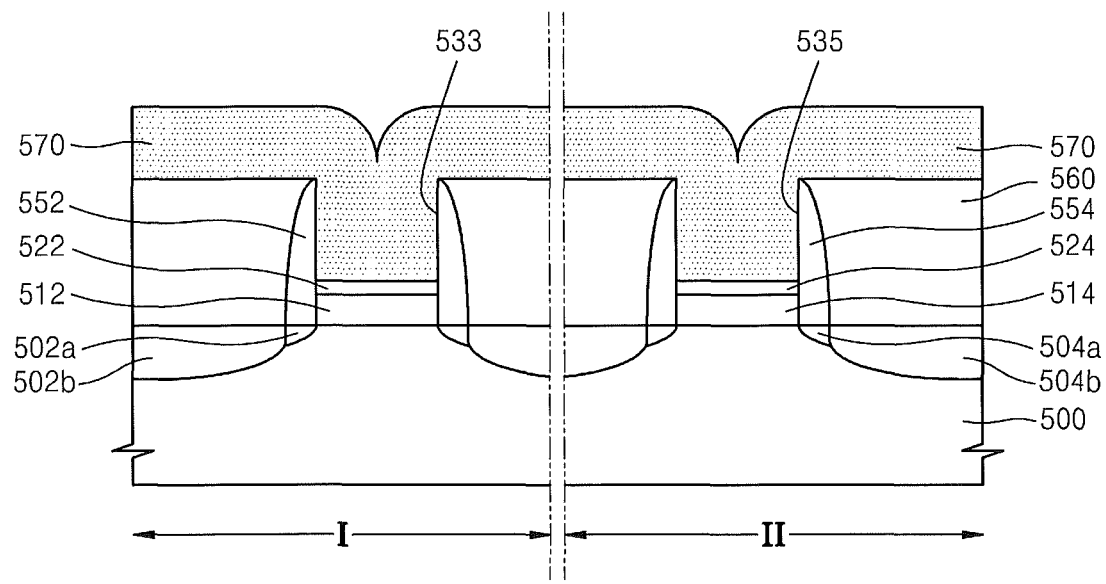
FIGS. 24 to 28 are cross-sectional views showing methods of manufacturing a semiconductor device, according to some embodiments.

Referring to FIG. 24, a sacrificial layer 570 is formed on an insulating interlayer 560 of a first region I and a second region II of a substrate 500 to at least partially fill a first trench 533 and a second trench 535. The first trench 533 is defined by a first buffer layer pattern 522 and sidewalls of first spacer 552, and the second trench 535 is defined by a second buffer layer pattern 524 and sidewalls of second spacer 554.

In some embodiments, the sacrificial layer 570 may be formed thick enough to completely fill the first and second trenches 533 and 535. Alternatively, the sacrificial layer 570 may be formed thin so as not to completely fill the first and second trenches 533 and 535.

Figure 25:
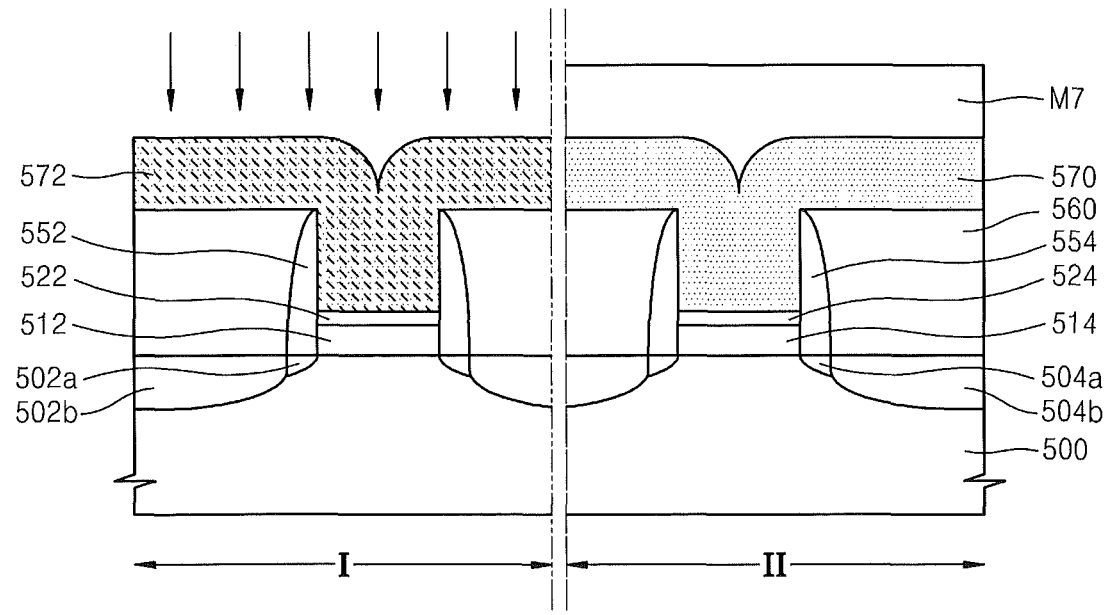

Referring to FIG. 25, a first sacrificial layer 572 doped with impurities is formed by forming a seventh mask M7 to cover the second region II of the substrate 500 and then implanting first impurities into the sacrificial layer 570 of the first region I of the substrate 500. The first impurities may include boron or phosphorus.

Then, the seventh mask M7 is removed.

Figure 26:
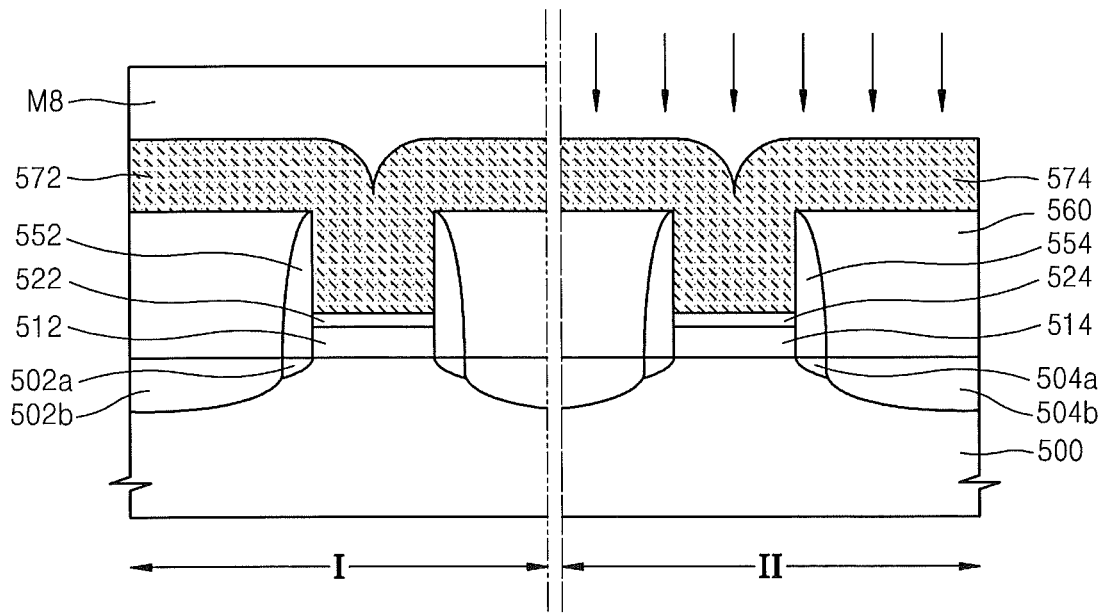

Referring to FIG. 26, a second sacrificial layer 574 doped with impurities is formed by forming an eighth mask M8 to cover the first region I of the substrate 500 and then implanting second impurities into the sacrificial layer 570 of the second region II of the substrate 500. The second impurities may include boron or phosphorus.

Then, the eighth mask M8 is removed.

Figure 27:
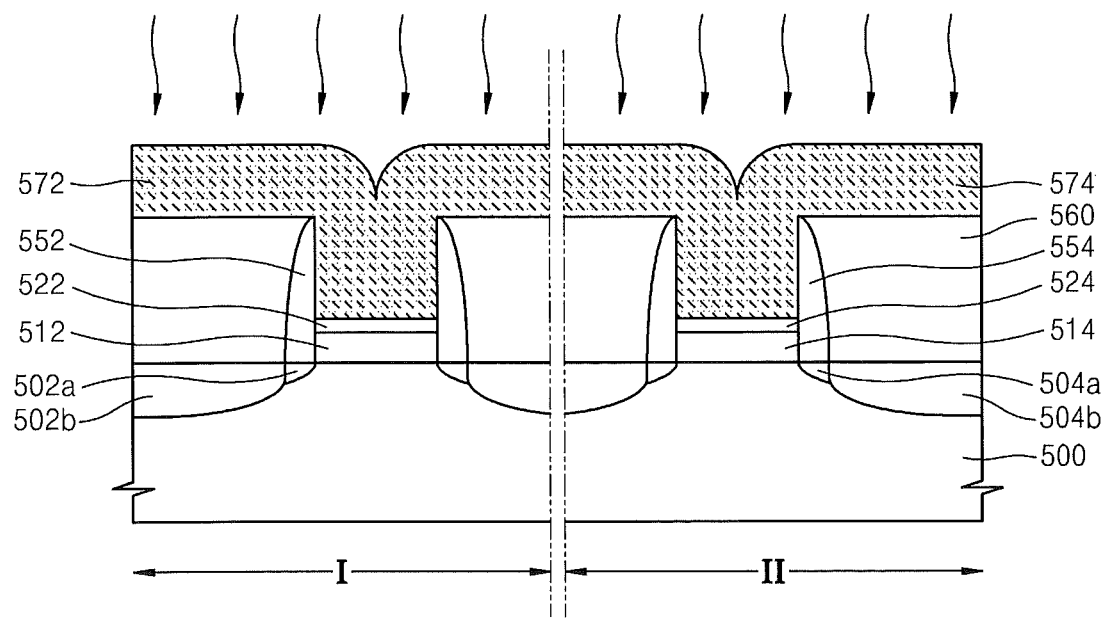

Referring to FIG. 27, the impurities implanted into the first sacrificial layer 572 and the second sacrificial layer 574 may be diffused into the first gate insulation layer 512 and the second gate insulation layer 514, respectively, by performing an annealing process on the substrate 500.

Figure 28:
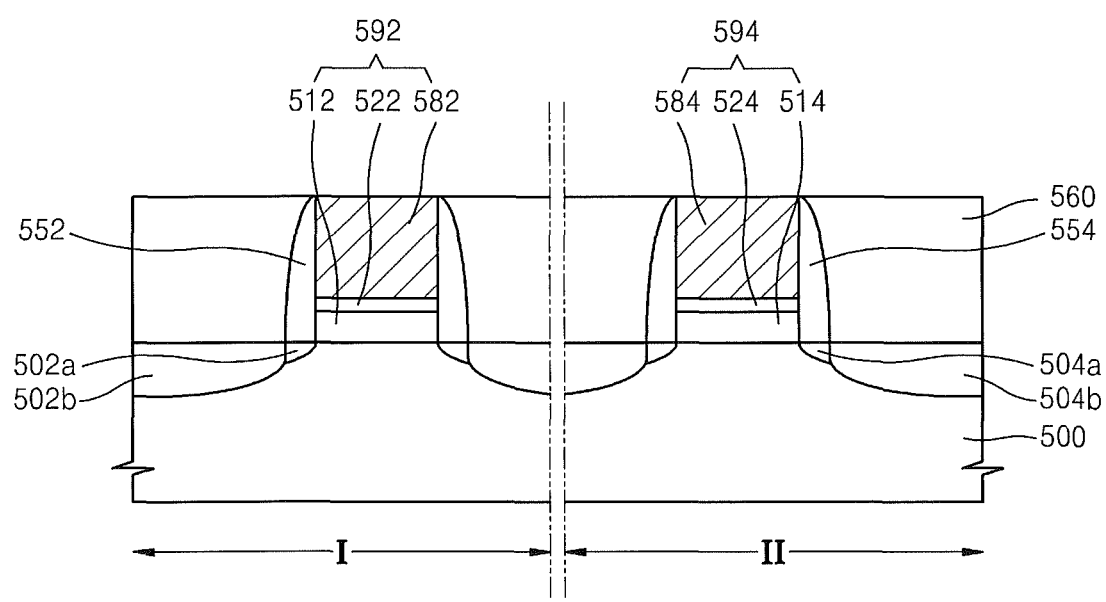

Referring to FIG. 28, the first and second sacrificial layers 572 and 574 are removed. A first gate electrode 582 is formed on the first buffer layer pattern 522 and sidewalls of the first spacer 552, and then a second gate electrode 584 is formed on the second buffer layer pattern 524 and sidewalls of the second spacer 554.

Accordingly, a first gate structure 592 and a second gate structure 594 may be formed in the first and second regions I and II of the substrate 500, respectively. The first gate structure 592 and the first and third impurity regions 502a and 502b may serve as a PMOS transistor, and the second gate structure 594 and the second and fourth impurity regions 504a and 504b may serve as an NMOS transistor.

According to the embodiments of the inventive concept illustrated in FIGS. 24 to 28, the sacrificial layers are formed, and impurities are implanted into the PMOS transistor and the NMOS transistor, and then the impurities are diffused into the gate insulation layers by performing an annealing process, thereby curing or otherwise neutralizing defects that may be generated in the gate insulation layers. Also, the PMOS transistor and the NMOS transistor may independently control a flat band voltage or a threshold voltage. Accordingly, the semiconductor device may have excellent electrical characteristics.

Figure 29:
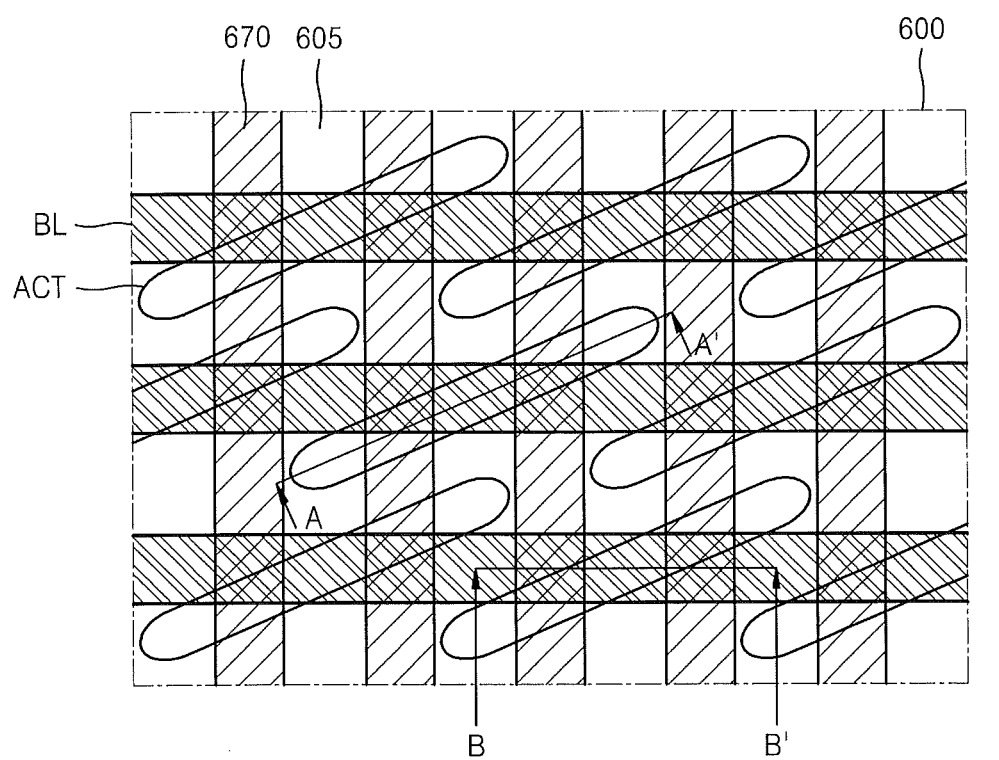
FIG. 29 is a layout showing a gate structure that may be configured according to methods of manufacturing a semiconductor device, according to some embodiments.

FIG. 29 is a layout showing a gate structure that may be configured according to some embodiments of the inventive concept.

Referring to FIG. 29, an isolation layer 605 for defining a plurality of active regions ACT in a cell area. A plurality of gate structures 670 may extend in a predetermined direction (y-axis direction of FIG. 29) throughout the active regions ACT and the isolation layer 605. In this regard, the gate structures 670 have shapes in which the gate structures 670 are buried in the substrate 600. A plurality of bit lines BL may extend in a direction (x-axis direction of FIG. 29) that is substantially perpendicular to the direction in which the gate structures 670 extend. Meanwhile, in addition to the cell area, a peripheral circuit area in which peripheral circuits are formed may further be formed in the substrate 600.

FIGS. 30 to 34 are cross-sectional views showing methods of manufacturing the semiconductor device of FIG. 29. The methods of manufacturing the semiconductor device of FIG. 29 are substantially similar to the methods of manufacturing the semiconductor device described with reference to FIGS. 1 to 8 except for a structure of the gate structure 670, and thus only differences between the embodiments described with reference to FIGS. 1 to 8 and the embodiments illustrated in FIGS. 30 to 34 will be described below. FIGS. 30 to 34 are cross-sectional views taken along a line A-A' and a line B-B' of FIG. 29.

Figure 30:
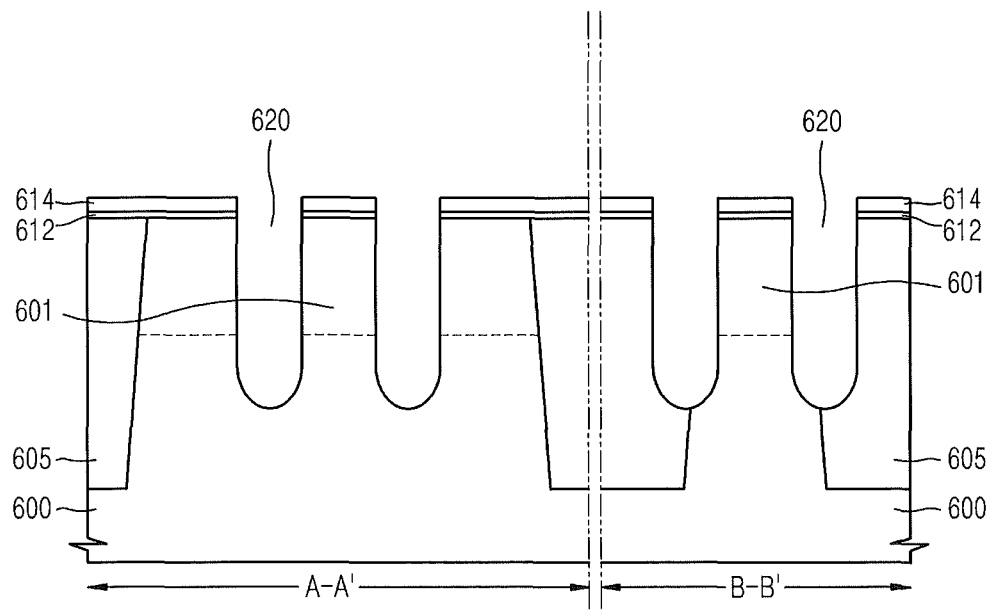
FIGS. 30 to 34 are cross-sectional views showing methods of manufacturing the semiconductor device of FIG. 29.

Referring to FIG. 30, an isolation layer 605 for defining an active region is formed on the substrate 600. The isolation layer 605 may be formed by performing a shallow trench isolation (STI) process. Then, an impurity region 601 is formed by implanting impurities on the active region of the substrate 600. The impurities may be n-type impurities, such as phosphorus or arsenic, or p-type impurities, such as boron.

Alternatively, the impurity region 601 may be formed on the active region by implanting the impurities on the substrate 600 first, and then forming the isolation layer 605 for defining the active region.

A stack of a pad oxide layer pattern 612 and a mask pattern 614 that expose a part of a top portion of the substrate 600 is formed on substrate 600. The mask pattern 614 may be formed of a hard mask pattern including a nitride layer or a polysilicon layer. Also, the mask pattern 614 may include a stack of the hard mask pattern and a photoresist pattern.

A trench 620 is formed by etching the exposed top portion of the substrate 600 by using the mask pattern 614 as an etching mask. A gate electrode is formed in the trench 620 in a subsequent process, and thus the trench 620 may be formed according to a layout of the gate structure of FIG. 29. In some embodiments, a plurality of the trenches 620 may be spaced apart at predetermined intervals, and the trenches 620 may be formed to extend in a direction in which the gate structure extends. The etching process may be performed by an anisotropic etching process. In an example embodiment, an isotropic etching process may further be performed after performing the anisotropic etching process, and thus the trenches 620 may have a rounded shape.

Meanwhile, after the trenches 620 are formed, a high-temperature baking process may further be performed on the substrate 600 in a hydrogen atmosphere.

Figure 31:
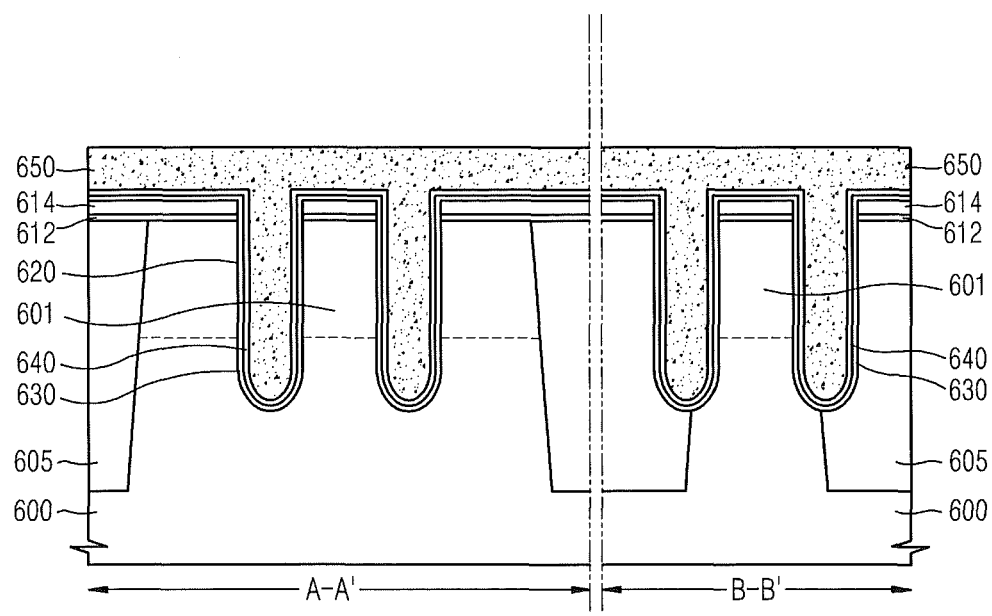

Referring to FIG. 31, a gate insulation layer 630 and a buffer layer 640 are sequentially formed on surfaces of the substrate 600 that are exposed in inner walls of the trenches 620. For example, the gate insulation layer 630 may be formed of silicon oxide, metal oxide with a high dielectric constant (high-k), or the like by performing a thermal oxidizing process, a CVD process, an ALD process, or the like. For example, the gate insulation layer 630 may include silicon oxide formed by performing the thermal oxidizing process on the substrate 600. The buffer layer 640 may be formed of titanium, titanium nitride, tantalum, tantalum nitride, ruthenium, or the like. In some embodiments, the buffer layer 640 may be formed to have a thickness in a range between about 1 and about 5 nm.

Then, a sacrificial layer 650 doped with impurities is formed on the buffer layer 640 to at least partially fill the trenches 620. In an example embodiment, the sacrificial layer 650 doped with impurities may be formed by doping the impurities in-situ in a process of forming a polysilicon layer by performing a CVD process, an ALD process, or the like. Alternatively, the sacrificial layer 650 doped with impurities may be formed by forming the polysilicon layer that is not doped with impurities on the buffer layer 640 to at least partially fill the trenches 620 and then implanting impurities, such as boron or phosphorus, into the polysilicon layer by performing an ion implantation process.

Figure 32:
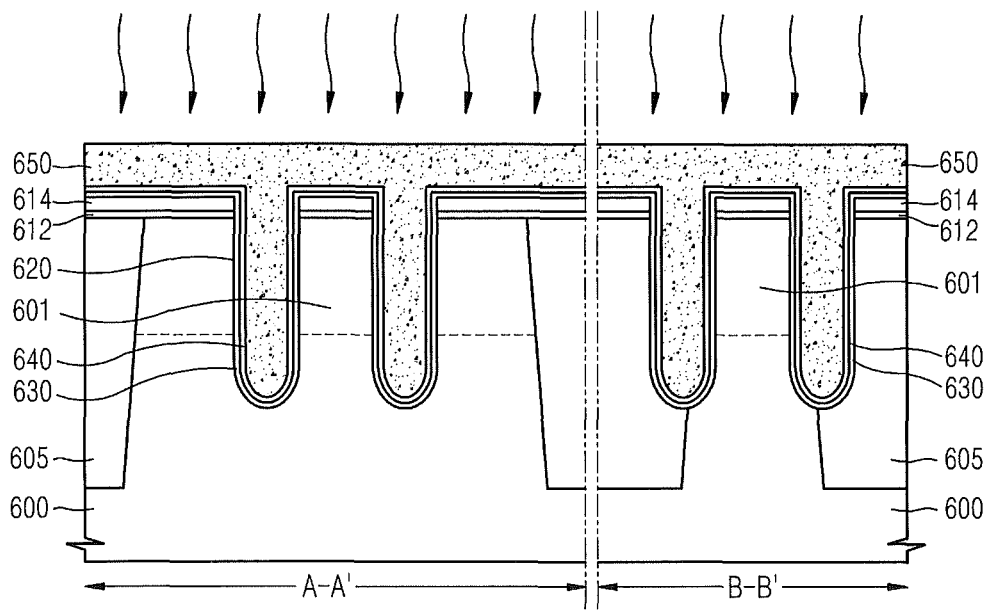

Referring to FIG. 32, the impurities included in the sacrificial layer 650 doped with impurities diffuse into the gate insulation layer 630 by performing an annealing process on the substrate 600. In this regard, the buffer layer 640 is formed to be thin enough that the impurities may diffuse into the gate insulation layer 630 through the buffer layer 640, thereby curing or otherwise neutralizing defects that may be present in the gate insulation layer 630.

Figure 33:
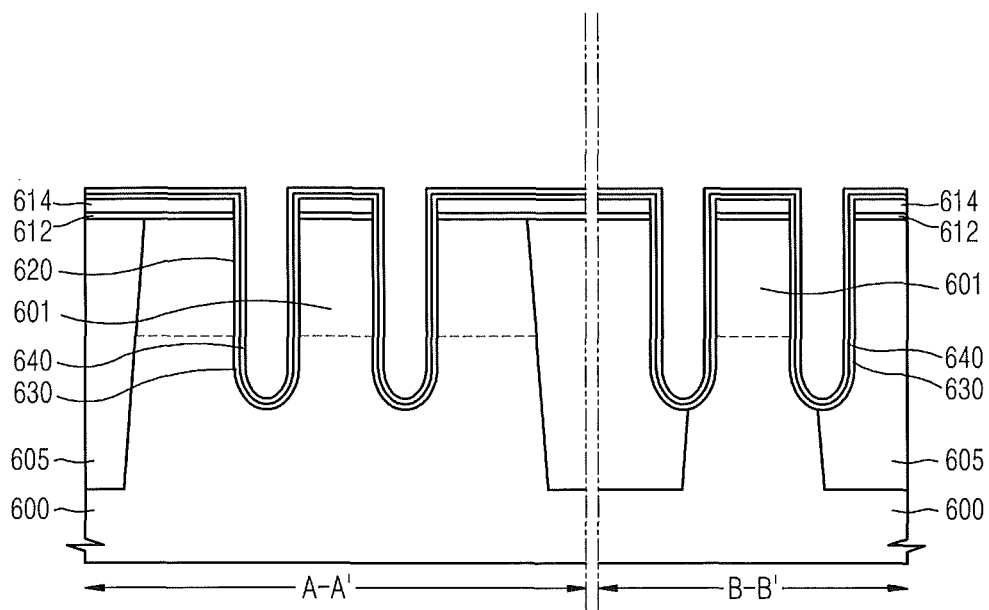

Referring to FIG. 33, the sacrificial layer 650 doped with impurities is removed by performing a wet etching process, and thus the buffer layer 640 formed in the trenches 620 may be exposed.

Figure 34:
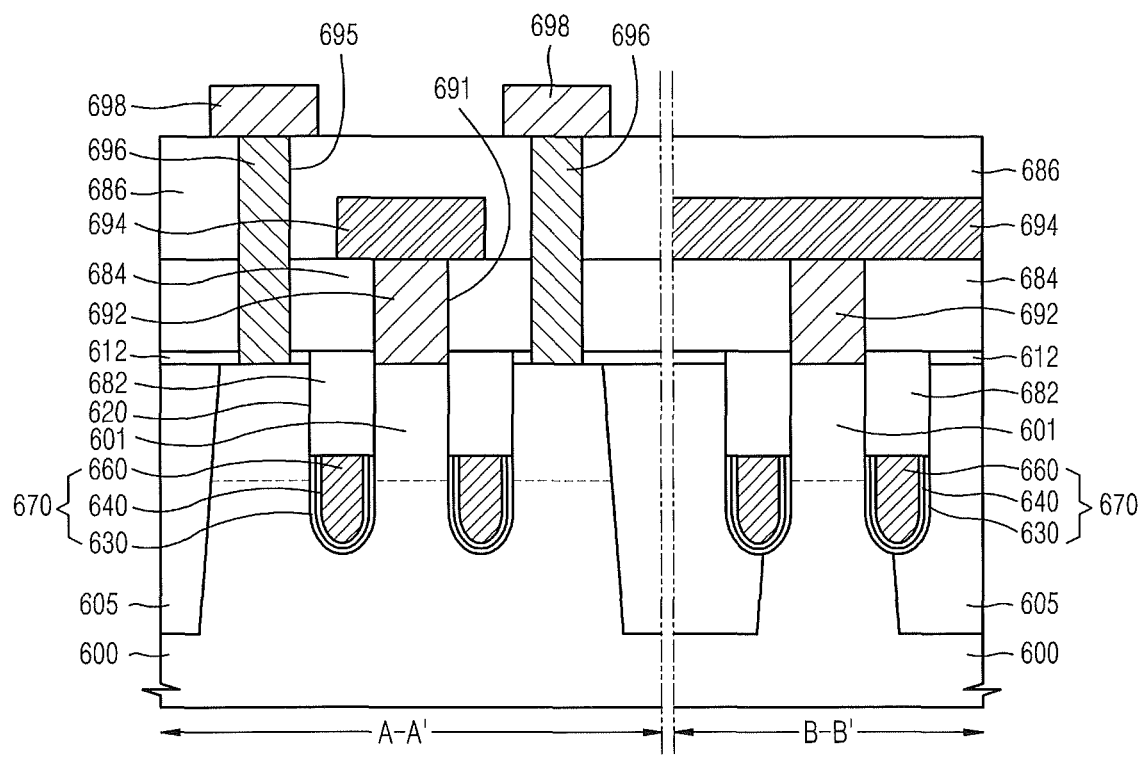

Referring to FIG. 34, a gate electrode 660 is formed in the trenches 620 by forming a gate electrode layer (not shown) to at least partially fill the trenches 620 on the buffer layer 640 and then performing an etch-back process on the gate electrode layer. In an example embodiment, the gate electrode layer may be formed of a conductive material such as a metal, metal nitride, or the like. For example, the gate electrode layer may be formed of any of copper, titanium, tantalum, ruthenium, tungsten, cobalt, nickel, aluminum, hafnium, zirconium, palladium, platinum, titanium nitride, and tantalum nitride, or a combination thereof. In some embodiments, a top surface of the gate electrode 660 may be formed substantially lower than a top surface of the substrate 600. Alternatively, the top surface of the gate electrode 660 may be coplanar with the top surface of the substrate 600.

Meanwhile, during the etch-back process performed on gate electrode layer, the buffer layer 640 and the gate insulation layer 630 formed in upper portions of the trenches 620 are removed, thereby exposing upper portions of sidewalls of the trenches 620. Then, the mask pattern 614 may be removed.

A capping layer 682 is formed in the trenches 620 by forming an insulating layer (not shown) on the gate electrode 660 to fill the trenches 620 and then planarizing the insulating layer. Accordingly, the gate insulation layer 630, the buffer layer 640, and the gate electrode 660 that are sequentially formed in each of the trenches 620 may form the gate structure 670. A plurality of the gate structures 670 are formed to be buried in the substrate 600.

A first insulating interlayer 684 is formed on the pad oxide layer pattern 612 and the capping layer 682. A first opening 691 exposing the impurity region 601 is formed through the first insulating interlayer 684 and the pad oxide layer pattern 612, and a conductive layer (not shown) is formed on the first insulating interlayer 684 to at least partially fill the first opening 691. A bit line contact 692 is formed to be electrically connected to the impurity region 601 by planarizing the conductive layer until the first insulating interlayer 684 is exposed.

A bit line 694 is formed on the first insulating interlayer 684 to be connected to the bit line contact 692 by forming a conductive layer (not shown) on the first insulating interlayer 684 and then patterning the conductive layer. Then, a second insulating interlayer 686 is formed on the first insulating interlayer 684 to cover the bit line 694.

A plurality of second openings 695 exposing the impurity region 601 are formed through the first and second insulating interlayer 684 and 686 and the pad oxide layer pattern 612, and then a plurality of capacitor contacts 696 are formed to at least partially fill the second openings 695. A plurality of contact pads 698 are formed on the capacitor contact 696 and the second insulating interlayer 686.

A capacitor (not shown) may further be formed on the contact pads 698.

The semiconductor device is formed by performing the above-described processes.

According to some embodiments of the inventive concept, the impurities may diffuse into the gate insulation layer 630 by forming the sacrificial layer 650 doped with impurities and then performing an annealing process on the substrate 600, thereby curing or otherwise neutralizing defects that may be present in the gate insulation layer 630. Thus, the semiconductor device may have excellent electrical characteristics.

While the inventive concept has been particularly shown, and described with reference to exemplary embodiments thereof, it will be understood that various changes in form, and details may be made therein without departing from the spirit, and scope of the following claims.

What is claimed is:

1. A method of manufacturing a semiconductor device, comprising:
    forming a gate insulation layer on a substrate;
    forming a sacrificial layer doped with impurities on the gate insulation layer;
    annealing the sacrificial layer to cause the impurities in the sacrificial layer to diffuse into the gate insulation layer;
    removing the sacrificial layer; and
    forming a gate electrode on the gate insulation layer.

2. The method of claim 1, wherein the impurities comprise boron or phosphorus.

3. The method of claim 1, wherein the annealing process is performed at a temperature of about 900° C. to about 1100° C.

4. The method of claim 1, wherein the sacrificial layer comprises a polysilicon layer.

5. The method of claim 1, wherein forming the sacrificial layer doped with impurities comprises providing the impurities in-situ while forming the sacrificial layer.

6. The method of claim 5, wherein the sacrificial layer is formed using a chemical vapor deposition (CVD) process or an atomic layer deposition (ALD) process.

7. The method of claim 1, wherein forming the sacrificial layer comprises:
    forming a polysilicon layer on the gate insulation layer; and
    implanting impurities into the polysilicon layer using an ion implantation process.

8. The method of claim 7, wherein the ion implantation process is performed using an impurity dose range between $10^{14}$ and $10^{17}$ atoms/cm$^2$.

9. The method of claim 1, wherein forming the sacrificial layer comprises:
    forming a buffer layer pattern on the gate insulation layer; and
    forming the sacrificial layer on the buffer layer pattern;
    wherein the buffer layer has thickness and composition selected to permit diffusion of the impurities from the sacrificial layer into the gate insulation layer.

10. The method of claim 9, wherein the buffer layer pattern comprises titanium, titanium nitride, tantalum, tantalum nitride, and/or ruthenium.

11. A method of manufacturing a semiconductor device, comprising:

forming a trench on a substrate;

forming a gate insulation layer on an inner wall of the trench;

forming a sacrificial layer including impurities on the gate insulation layer;

annealing the sacrificial layer to cause the impurities in the sacrificial layer diffuse into the gate insulation layer;

removing the sacrificial layer; and forming a gate electrode on the gate insulation layer.

12. The method of claim 11, further comprising forming a buffer layer on the gate insulation layer, wherein the sacrificial layer is formed on the buffer layer, and wherein the buffer layer has thickness and composition selected to permit diffusion of the impurities from the sacrificial layer into the gate insulation layer.

13. The method of claim 12, wherein forming the gate electrode comprises:

forming a gate electrode layer to at least partially fill the trench on the buffer layer; and performing an etch-back process on the gate electrode layer until a top surface of the gate electrode layer is lower than a top surface of the substrate.

14. The method of claim 11, further comprising forming an impurity region on the substrate adjacent to the trench by performing an ion implantation process on the substrate.

15. The method of claim 11, wherein the sacrificial layer comprises a polysilicon layer.

16. A method of manufacturing a semiconductor device including a high-k gate insulation layer, comprising:

forming a buffer layer on the high-k gate insulation layer;

forming a sacrificial layer containing impurities on the buffer layer;

diffusing impurities from the sacrificial layer through the buffer layer and into the high-k gate insulation layer;

removing the sacrificial layer; and forming a gate electrode on the buffer layer.

17. The method of claim 16 wherein the buffer layer has a thickness and composition selected to permit diffusion of the impurities from the sacrificial layer into the gate insulation layer.

* * * * *